(12) United States Patent
Kim (10) Patent No.: US 10,522,511 B2
(45) Date of Patent: Dec. 31, 2019

(54) SEMICONDUCTOR PACKAGES HAVING INDICATION PATTERNS

(71) Applicant: SK hynix Inc., Icheon-si, Gyeonggi-do (KR)

(72) Inventor: Moon Soo Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/961,569

(22) Filed: Apr. 24, 2018

(65) Prior Publication Data

US 2019/0043834 A1 Feb. 7, 2019

(30) Foreign Application Priority Data

Aug. 4, 2017 (KR) .................. 10-2017-0099221

(51) Int. Cl.
| | |
|---|---|
| *H01L 23/48* | (2006.01) |
| *H01L 23/52* | (2006.01) |
| *H01L 29/40* | (2006.01) |
| *H01L 25/065* | (2006.01) |
| *H01L 23/544* | (2006.01) |
| *H01L 23/00* | (2006.01) |

(52) U.S. Cl.
CPC ........ *H01L 25/0657* (2013.01); *H01L 23/544* (2013.01); *H01L 23/564* (2013.01); *H01L 2223/54453* (2013.01); *H01L 2225/06555* (2013.01); *H01L 2225/06586* (2013.01); *H01L 2225/06593* (2013.01)

(58) Field of Classification Search
CPC . H01L 25/0657; H01L 23/564; H01L 23/544; H01L 2225/06555; H01L 2225/06593; H01L 2225/06586; H01L 2223/54453
See application file for complete search history.

(56) References Cited

U.S. PATENT DOCUMENTS

2002/0094679 A1\* 7/2002 Song ................ H01L 23/544
438/666
2002/0114507 A1 8/2002 Lynch et al.
(Continued)

FOREIGN PATENT DOCUMENTS

KR 1020070076846 A 7/2007

*Primary Examiner* — Ismail A Muse
(74) *Attorney, Agent, or Firm* — William Park & Associates Ltd.

(57) ABSTRACT

A semiconductor package includes a package substrate, a first semiconductor chip on the package substrate, an encapsulant layer covering the first semiconductor chip, bar patterns disposed within the package substrate, each bar pattern having a first end and a second end. An encapsulant layer formed to cover at least the bar patterns and the first semiconductor chip, wherein the semiconductor package having the encapsulant layer has a side surface with exposing one or more second ends of the bar patterns, wherein the bar patterns having different lengths are positioned substantially along a predetermined direction with respect to the first semiconductor chip such that the one or more second ends of the bar patterns exposed through the side surface of the semiconductor package indicate a distance between the side surface and the first semiconductor chip.

20 Claims, 9 Drawing Sheets

(56) References Cited

U.S. PATENT DOCUMENTS

| | | | | |
|---|---|---|---|---|
| 2008/0164468 A1* | 7/2008 | Chen | ............... | H01L 23/585 |
| | | | | 257/48 |
| 2009/0134527 A1* | 5/2009 | Chang | ............... | H01L 24/25 |
| | | | | 257/777 |
| 2010/0117080 A1* | 5/2010 | Chen | ............... | H01L 22/34 |
| | | | | 257/48 |
| 2010/0133669 A1* | 6/2010 | Jao | ............... | H01L 21/78 |
| | | | | 257/669 |
| 2011/0089581 A1* | 4/2011 | Pol | ............... | H01L 23/544 |
| | | | | 257/797 |
| 2011/0287627 A1* | 11/2011 | Chen | ............... | H01L 22/34 |
| | | | | 438/622 |
| 2015/0200146 A1* | 7/2015 | Reber | ............... | H01L 22/34 |
| | | | | 257/506 |
| 2015/0214077 A1* | 7/2015 | Tsai | ............... | H01L 21/78 |
| | | | | 257/737 |
| 2015/0311162 A1* | 10/2015 | Chen | ............... | H01L 21/78 |
| | | | | 438/12 |
| 2015/0371957 A1* | 12/2015 | Wang | ............... | H01L 23/562 |
| | | | | 257/620 |
| 2016/0358870 A1* | 12/2016 | Kuan | ............... | H01L 24/09 |
| 2017/0033078 A1* | 2/2017 | Kuan | ............... | H01L 23/3114 |
| 2018/0122844 A1* | 5/2018 | Li | ............... | H01L 27/14625 |
| 2018/0226331 A1* | 8/2018 | Sarkar | ............... | H01L 23/49827 |
| 2019/0051602 A1* | 2/2019 | Hatasawa | ............... | H01L 25/07 |
| 2019/0067248 A1* | 2/2019 | Yoo | ............... | H01L 25/0657 |
| 2019/0139841 A1* | 5/2019 | Stamper | ............... | H01L 22/32 |

\* cited by examiner

SEMICONDUCTOR PACKAGES HAVING INDICATION PATTERNS

CROSS-REFERENCE TO RELATED APPLICATIONS

The present application claims priority under 35 U.S.C 119(a) to Korean Application No. 10-2017-0099221, filed on Aug. 4, 2017, which is incorporated herein by reference in its entirety.

BACKGROUND

1. Technical Field

The present disclosure relates generally to semiconductor package technologies and, more particularly, to semiconductor packages including indication patterns for determining a distance between a semiconductor chip and an outer side surface of an encapsulant layer.

2. Related Art

As electronic devices shrink, a size of semiconductor packages employed in the electronic devices is reduced. In such a case, a distance between a side surface of a semiconductor chip embedded in a semiconductor package and a side surface of the semiconductor package is reduced. Accordingly, it may be important to stably maintain a distance between the semiconductor chip disposed in the semiconductor package and a side surface of the semiconductor package to prevent degradation of reliability of the semiconductor package. That is, a technique for measuring and monitoring a distance between the semiconductor chip disposed in the semiconductor package and a side surface of the semiconductor package may be required to ensure a reliable semiconductor package.

In general, it may be difficult to directly observe the semiconductor chips disposed in a semiconductor package after the semiconductor package is fabricated. Thus, a destructive analysis technique or a non-destructive analysis technique using an X-ray is used to obtain information on positions of semiconductor chips disposed in a semiconductor package. In such a case, a long and complicated process may be needed to obtain information on positions of semiconductor chips disposed in a semiconductor package. Accordingly, it may be necessary to develop a technique for accurately and simply measuring distances between the semiconductor chip disposed in the semiconductor package and a side surface of the semiconductor package without using a destructive analysis technique or a non-destructive analysis technique of an X-ray.

SUMMARY

According to an embodiment, there is provided a semiconductor package. The semiconductor package includes a package substrate, a first semiconductor chip on the package substrate, bar patterns disposed within the package substrate, each bar pattern having a first end and a second end. An encapsulant layer formed to cover at least the bar patterns, wherein the semiconductor package having the encapsulant layer has a side surface with exposing one or more second ends of the bar patterns, wherein the bar patterns having different lengths are positioned substantially along a predetermined direction with respect to the first semiconductor chip such that the one or more second ends of the bar patterns exposed through the side surface of the semiconductor package indicate a distance between the side surface and the first semiconductor chip.

According to another embodiment, there is provided a semiconductor package. The semiconductor package includes a package substrate, a first semiconductor chip on the package substrate, bar patterns disposed within the package substrate, each bar pattern having a first end and a second end. An encapsulant layer formed to cover at least the bar patterns, wherein a portion of the semiconductor package having the encapsulant layer is capable of being cut to expose one or more bar patterns covered therein through a cut surface, wherein the bar patterns having different lengths are positioned substantially along a predetermined direction with respect to the first semiconductor chip such that the one or more bar patterns exposed through the cut surface of the semiconductor package indicate a distance between the cut surface and the first semiconductor chip.

According to another embodiment, there is provided a semiconductor package. The semiconductor package includes a package substrate, a first semiconductor chip disposed on the package substrate, an encapsulant layer covering the first semiconductor chip, and an array of bar patterns constituting an indication pattern disposed in or on the package substrate. Each of the bar patterns includes a first end being in contact with a side surface of the semiconductor package and a second end positioned to face the first semiconductor chip. Lengths of the bar patterns are different from each other.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (Re-RAM) circuits, ferroelectric random access memory (Fe-RAM) circuits, or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 1:
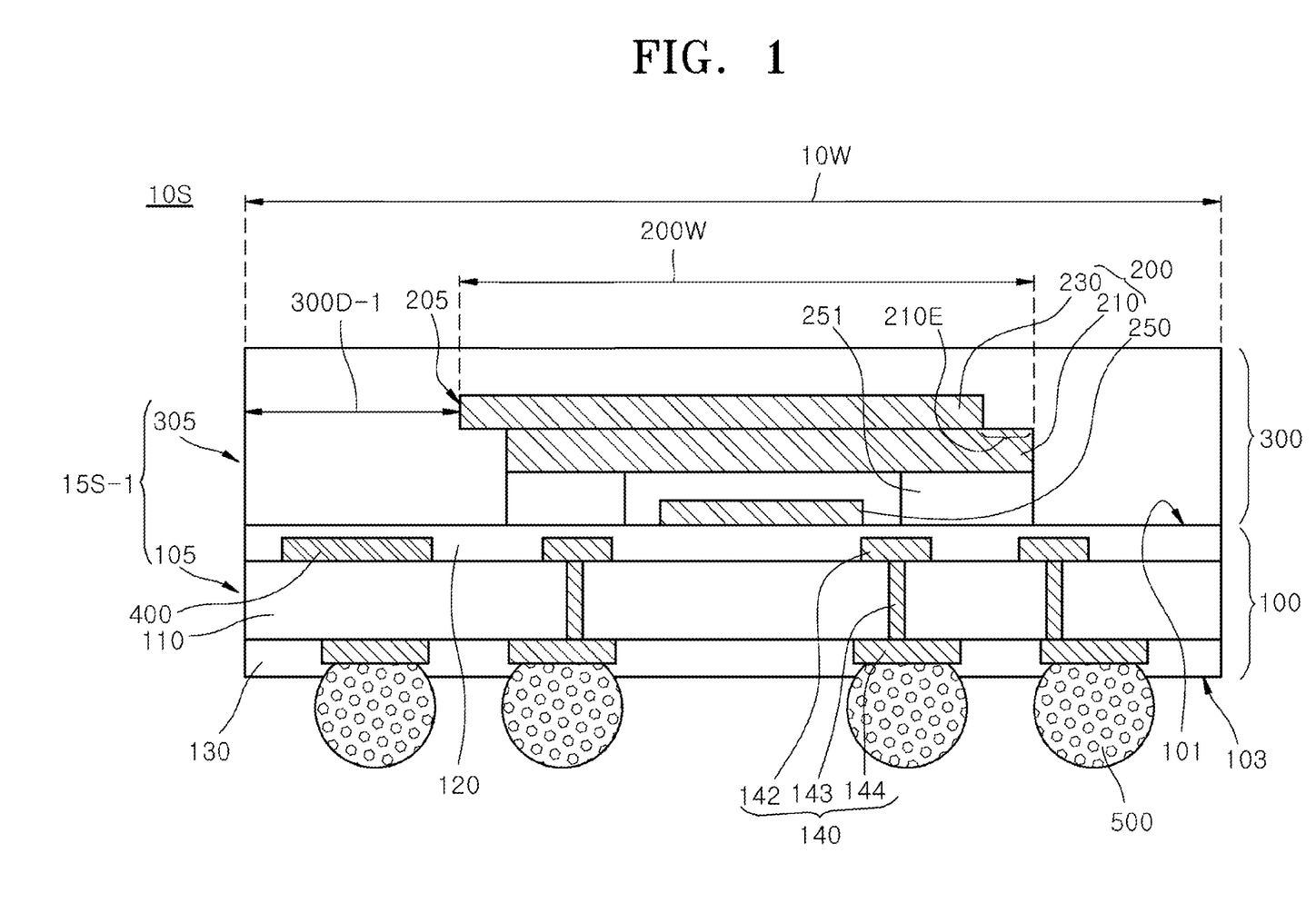
FIG. 1 is a cross-sectional view of a semiconductor package according to an embodiment.
Figure 2:
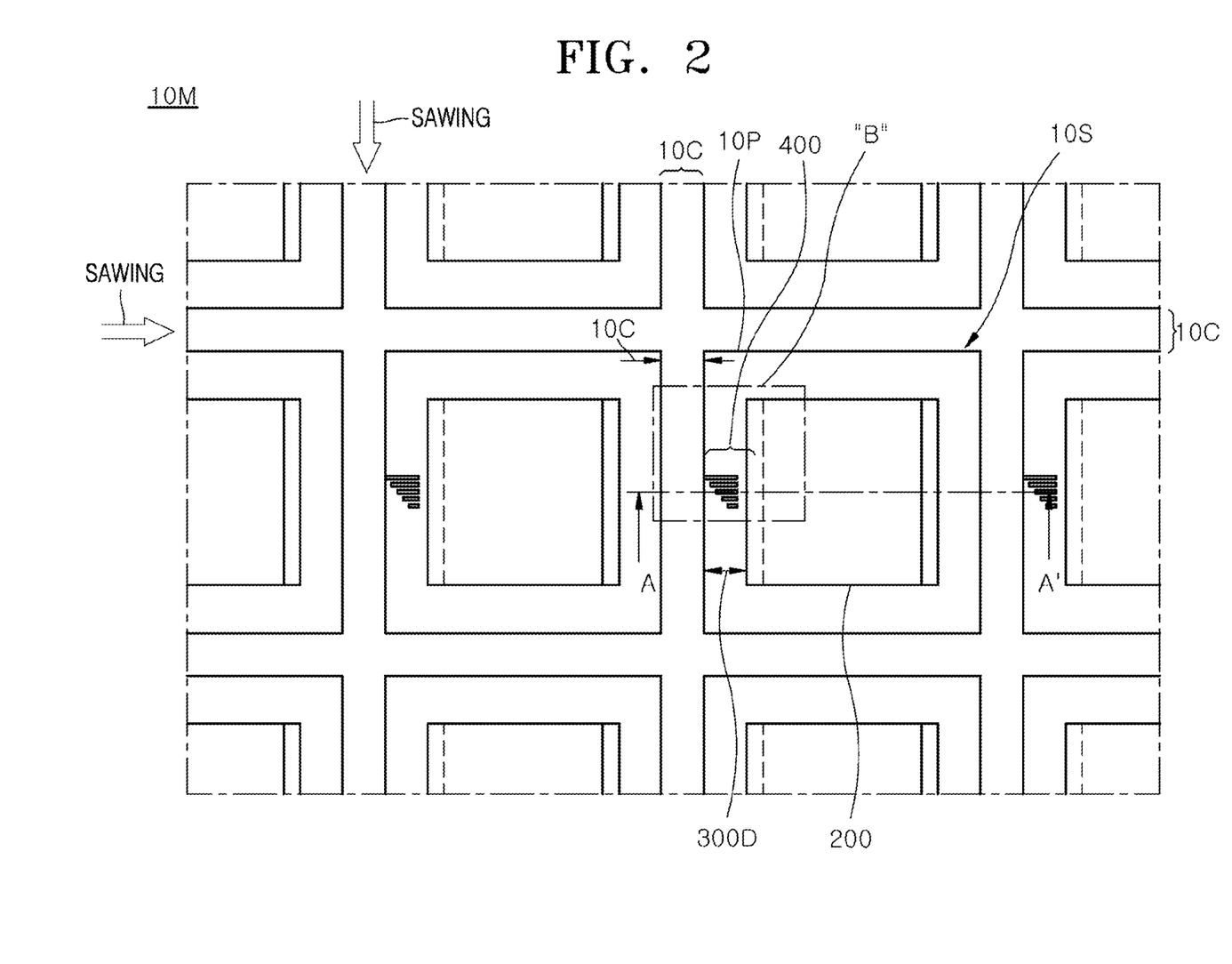
FIG. 2 is a plan view illustrating a semiconductor package array including a plurality of semiconductor packages, each of which has a same configuration as the semiconductor package shown in FIG. 1, before the plurality of semiconductor packages are separated from each other.
Figure 3:
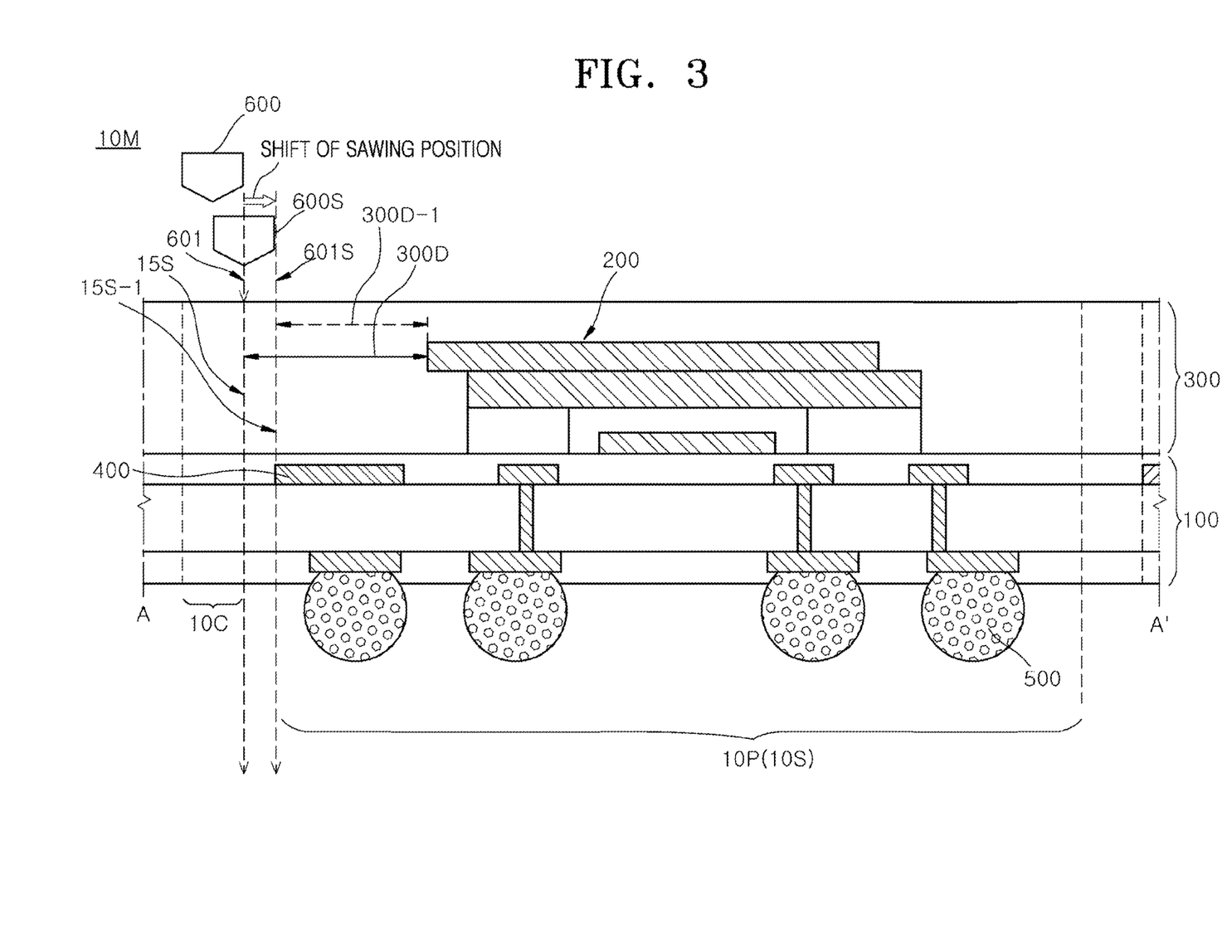
FIG. 3 is a cross-sectional view taken along a line A-A' of FIG. 2.

FIG. 1 is a cross-sectional view illustrating a semiconductor package 10S according to an embodiment. FIG. 2 is a plan view illustrating a semiconductor package array 10M including a plurality of semiconductor packages, each of which has a same configuration as the semiconductor package 10S shown in FIG. 1, before the plurality of semiconductor packages are separated from each other. FIG. 3 is a cross-sectional view taken along a line A-A' of FIG. 2.

Referring to FIG. 1, the semiconductor package 10S may include a package substrate 100, a semiconductor chip 230 disposed on the package substrate 100, and an encapsulant layer 300 covering the semiconductor chip 230. Another semiconductor chip 210 may be additionally disposed on the package substrate 100. The semiconductor chip 210 may correspond to a first semiconductor chip, and the semiconductor chip 230 may correspond to a second semiconductor chip. The first and second semiconductor chips 210 and 230 may constitute a semiconductor chip stack 200. The plurality of semiconductor packages 10S of the semiconductor package array 10M shown in FIG. 2 may be separated from each other. That is, a singulation process may be applied to the semiconductor package array 10M shown in FIG. 2 to separate semiconductor package 10S shown in FIG. 1 into individual semiconductor packages.

The semiconductor package array 10M shown in FIGS. 2 and 3 may be comprised of the plurality of semiconductor packages 10S which are separated by a cutting region 10C. For the purpose of ease and convenience in explanation, discussion of the encapsulant layer 300 is omitted in FIG. 2. Package regions 10P defined and surrounded by the cutting region 10C may be separated from each other to provide the plurality of semiconductor packages 10S. The cutting region 10C may correspond to a scribe lane region or a sawing region. The cutting region 10C may have a grid shape or a lattice shape that define the package regions 10P which correspond to lattice windows. Because the plurality of semiconductor packages 10S are separated from each other by sawing the cutting region 10C, the cutting region 10C may be removed during a sawing process or a singulation process for separating the plurality of semiconductor packages 10S. The sawing process may be performed using a cutting means such as a sawing blade (600 of FIG. 3).

Referring to FIG. 3, a cutting means, for example, the sawing blade 600 may possibly not be accurately aligned due to allowable tolerance of a sawing machine including the sawing blade 600 with a normal sawing position 601 in the cutting region 10C during the sawing process. In such a case, a portion of each of the package regions 10P may be removed while the sawing process is performed, where the removal of a portion of each of the package regions 10P is not desired. That is, a shifted sawing blade 600S may be aligned with a shifted sawing position 601S that is positioned in the package region 10P because of the process tolerance of the sawing machine. As a result, a portion of each package region 10P may be undesirably removed while the sawing process is performed. The sawing blade 600 may be merely an example of a cutting means that may be used in a sawing process.

If the sawing blade 600 is accurately aligned with the cutting region 10C after the sawing process, the semiconductor package 10S may have a side surface 15S taken along the normal sawing position 601. However, if an actual sawing position moves from the normal sawing position 601 to the shifted sawing position 601S after the sawing process, the semiconductor package 10S may have a side surface 15S-1 which runs along the shifted sawing position 601S that is moved from the normal sawing position 601 toward the semiconductor chip stack 200. In such a case, a distance 300D-1 between the side surface 15S-1 and the semiconductor chip stack 200 may become less than a distance 300D between the side surface 15S and the semiconductor chip stack 200 because the side surface 15S-1 is positioned inside the semiconductor package 10S. In FIG. 1, the side surface 15S-1 of the semiconductor package 10S may include a side surface 105 of the package substrate 100 and an outer side surface 305 of the encapsulant layer 300.

As described above, if the actual sawing position moves toward the semiconductor chip stack 200 such that a portion of the package region 10P is removed, the distance 300D-1 between the side surface 15S-1 and the semiconductor chip stack 200 may be less than a desired value. That is, a package side margin related to the distance 300D-1 between the side surface 15S-1 and the semiconductor chip stack 200 of the semiconductor package 10S may be reduced. In such a case, a width of a sidewall portion of the encapsulant layer 300 may be reduced such that the semiconductor chip stack 200 is not sufficiently protected by the encapsulant layer 300. If the package side margin of the semiconductor package 10S is reduced moisture may easily infiltrate into the semiconductor package 10S through an interface between the encapsulant layer 300 and the package substrate 100. The infiltrating moisture may cause the package substrate 100 to degrade the reliability of the semiconductor package 10S or may cause malfunction of the semiconductor chips 210 and 230. In addition, if moisture infiltrates into the semiconductor package 10S, the first semiconductor chip 210 may be lifted or delaminated from the package substrate 100. Moreover, if moisture infiltrates into the semiconductor package 10S, an adhesive strength between the encapsulant layer 300 and the package substrate 100 may be reduced which may cause a delamination phenomenon of the encapsulant layer 300.

It may be necessary to determine a margin of the distance 300D-1 between the side surface 15S-1 of the semiconductor package 10S and the semiconductor chip stack 200 to sort good packages from failed packages and to realign the sawing blade 600. It may be difficult, however, to observe the semiconductor chip stack 200 embedded in the semiconductor package 10S and to measure or determine a package side margin of the semiconductor package 10S after the semiconductor package 10S is fabricated. This is because the encapsulant layer 300 covering the semiconductor chip stack 200 may be formed of an opaque material and the package substrate 100 supporting the semiconductor chip stack 200 may also be formed of an opaque dielectric material.

In FIG. 1, the distance 300D-1 between the side surface 15S-1 of the semiconductor package 10S and a side surface 205 of the semiconductor chip stack 200 is exaggerated for clarity of illustration. If a ratio of a width 200W of the semiconductor chip stack 200 to a width 10W of the semiconductor package 10S increases, an allowable range of the distance 300D-1 between the side surface 15S-1 of the semiconductor package 10S and a side surface 205 of the semiconductor chip stack 200 may be reduced. In such a case, as illustrated in FIG. 3, the distance 300D-1 may be further reduced to be out of allowable range if the sawing process is performed along the shifted sawing position 601S. That is, a width of a sidewall of the encapsulant layer 300 may be reduced to cause a smaller package side margin of the semiconductor package 10S. Also, it may be difficult to determine the package side margin of the semiconductor package 10S even after the sawing process is performed.

Referring again to FIGS. 1 and 2, the semiconductor package 10S may also include an indication pattern 400. The indication pattern 400 may be designed such that after the sawing process is performed the distance 300D-1 between the side surface 15S-1 of the semiconductor package 10S and a side surface 205 of the semiconductor chip stack 200 can be measured or determined. The indication pattern 400 may be disposed in or on the package substrate 100 and may be cut during the sawing process. That is, if the indication pattern 400 is cut during the sawing process, after the sawing process is performed a side surface of the indication pattern 400 may be exposed at the side surface 15S-1 of the semiconductor package 10S. Accordingly, it may be possible to observe the exposed side surface of the cut indication pattern 400 after the sawing process is performed. Examples and functions of the indication pattern 400 will be described in detail with reference to FIGS. 4 to 8.

Although FIG. 1 illustrates an example in which the semiconductor chip stack 200 is disposed on the package substrate 100, at least one of the semiconductor chips constituting the semiconductor chip stack 200 may be embedded in the package substrate 100 according to the embodiment. The semiconductor chip stack 200 may be provided such that the first and second semiconductor chips 210 and 230 are stacked to be offset. For example, the second semiconductor chip 230 may be stacked on the first semiconductor chip 210 and offset from the first semiconductor chip 210 to expose an edge portion 210E of the first semiconductor chip 210. In some embodiments, the second semiconductor chip 230 may be vertically stacked on the first semiconductor chip 210 without being offset from the first semiconductor chip 210.

A third semiconductor chip 250 may be additionally disposed under the first semiconductor chip 210, and between the first semiconductor chip 210 and the package substrate 100. The first and second semiconductor chips 210 and 230 may have substantially the same function, and the third semiconductor chip 250 may have a different function from the first and second semiconductor chips 210 and 230. For example, if the first and second semiconductor chips 210 and 230 are NAND-type flash memory chips, the third semiconductor chip 250 may be a controller chip that controls operations of the first and second semiconductor chips 210 and 230.

A supporting part 251 may be included in the semiconductor package 10S to provide a space in which the third semiconductor chip 250 may be disposed. The supporting part 251 may be disposed between the first semiconductor chip 210 and the package substrate 100 to support the first semiconductor chip 210. The supporting part 251 may formed in a square or rectangular enclosure without a top and have a cavity in a central portion thereof, and the third semiconductor chip 250 may be disposed in the cavity of the supporting part 251. The supporting part 251 may provide support for edge portions of the first semiconductor chip 210, and the supporting part 251 may form and provide the cavity. The supporting part 251 may be an adhesive layer.

The package substrate 100 may include an interconnection structure that electrically connects the semiconductor chip stack 200 to an external device. The interconnection structure may include conductive interconnection patterns 140. The conductive interconnection patterns 140 may include first interconnection patterns 142 disposed on a surface of a body layer 110 of the package substrate 100. A first dielectric layer 120 may be disposed on a surface of the body layer 110 to cover the first interconnection patterns 142. A top surface of the first dielectric layer 120 may correspond to a first surface 101 of the package substrate 100. The conductive interconnection patterns 140 may further include second interconnection patterns 144 disposed on a surface of the body layer 110 opposite to the surface on which the first interconnection patterns 142 are disposed. A second dielectric layer 130 may be disposed on a surface of the body layer 110 to cover the second interconnection patterns 144. A bottom surface of the second dielectric layer 130 may correspond to a second surface 103 of the package substrate 100.

The conductive interconnection patterns 140 may further include internal interconnection patterns 143, where the internal interconnection patterns 143 are disposed to penetrate the body layer 110 and to electrically connect the first interconnection patterns 142 to the second interconnection patterns 144. The internal interconnection patterns 143 may include conductive vias that substantially penetrate the body layer 110. The second dielectric layer 130 may be provided to leave the second interconnection patterns 144 exposed. Outer connectors 500 such as solder balls may be attached to the second interconnection patterns 144 left exposed by the second dielectric layer 130. Each of the first and second dielectric layers 120 and 130 may include a dielectric material, for example, a solder resist material.

The indication pattern 400 may be positioned at a same level as any one of various conductive layers included in the package substrate 100. The indication pattern 400 may be disposed at a same level as any one of the conductive interconnection patterns 140. The indication pattern 400 may be disposed at a same level as the first interconnection patterns 142 corresponding to topmost patterns of the conductive interconnection patterns 140. The first interconnection patterns 142 may be disposed at a closest level to the first surface 101 of the package substrate 100. Accordingly, the first interconnection patterns 142 may be disposed at a level closest to the first semiconductor chip 210 among the levels of the interconnection patterns 142, 143, and 144. Because the semiconductor chips 210, 230, and 250 are disposed on the first surface 101 of the package substrate 100, the first interconnection patterns 142 may correspond to the topmost patterns of the conductive layers included in the package substrate 100. In such a case, the first interconnection patterns 142 may correspond to the farthest conductive patterns from the second surface 103 of the package substrate 100, where the outer connectors 500 may be disposed on the second interconnection pattern 144 which reside in the second surface 103 of the package substrate 100. The first interconnection patterns 142 and the indication pattern 400 may be simultaneously formed by patterning a conductive layer.

The indication pattern 400 may be formed of a material which may be distinguished from the encapsulant layer 300, the body layer 110, the first dielectric layer 120, and the second dielectric layer 130. The indication pattern 400 may be formed to have a shape which may be distinguished from shapes of the encapsulant layer 300, the body layer 110, the first dielectric layer 120, and the second dielectric layer 130. The indication pattern 400 may be formed of a material having a color distinguished from colors of the encapsulant layer 300, the body layer 110, the first dielectric layer 120, and the second dielectric layer 130. The indication pattern 400 may be formed to include the same conductive material as the conductive interconnection patterns 140. For example, the indication pattern 400 may be formed to include a copper material.

Figure 4:
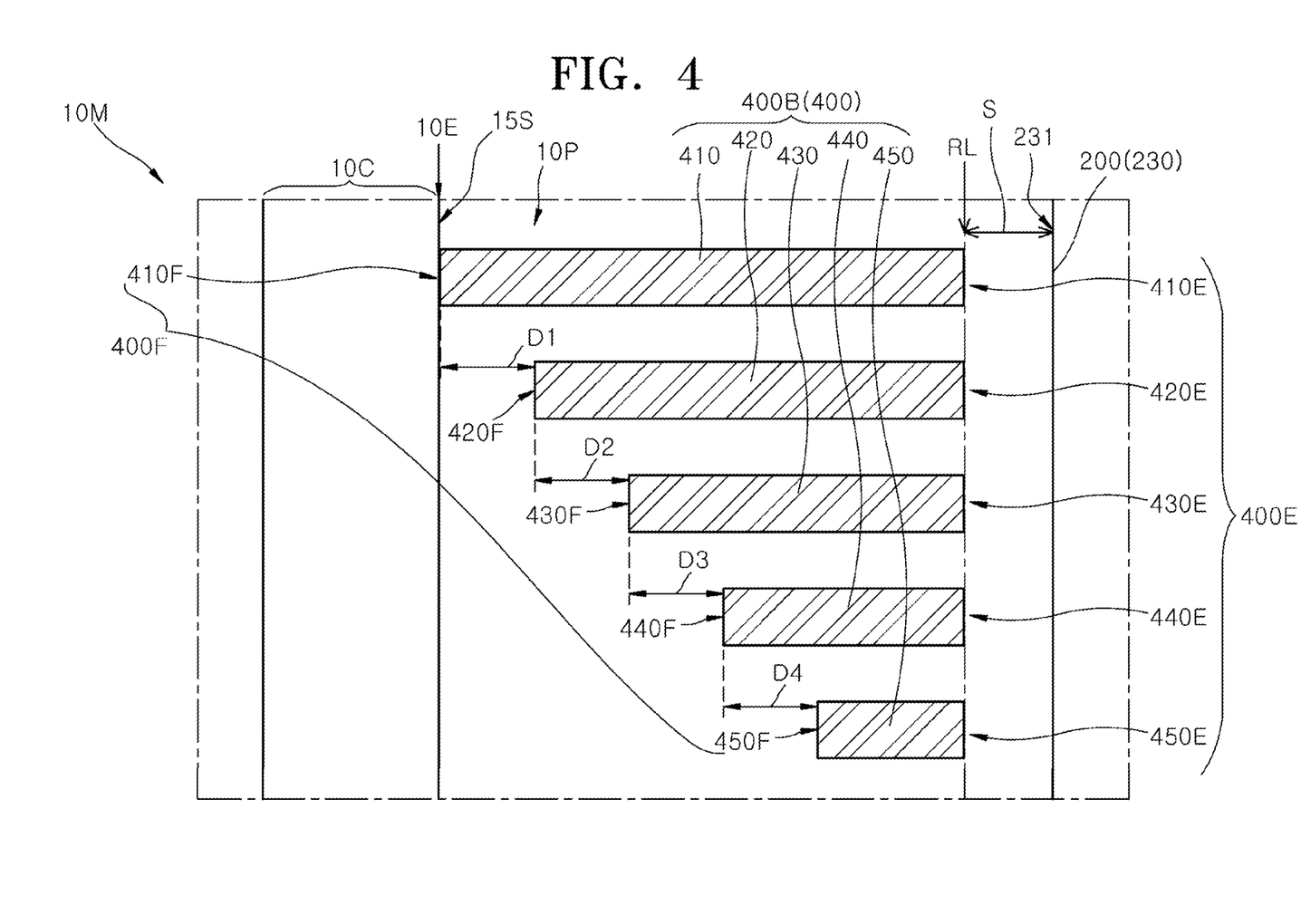
FIG. 4 is a plan view illustrating an example of an indication pattern employed in a semiconductor package according to an embodiment.
Figure 5:
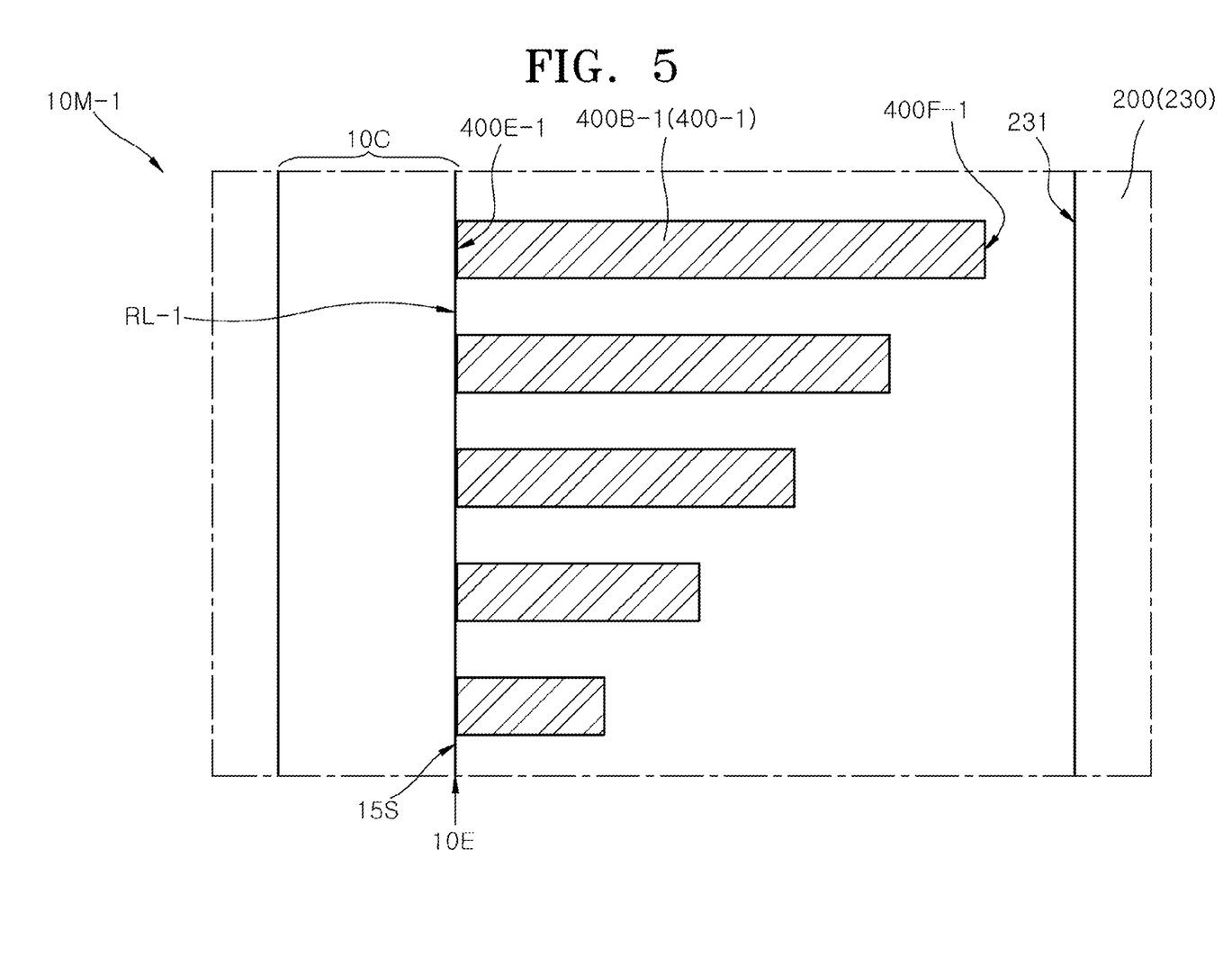
FIG. 5 is a plan view illustrating another example of an indication pattern employed in a semiconductor package according to an embodiment.

FIG. 4 is a plan view illustrating one of the indication patterns 400 employed in the semiconductor package array according to an embodiment. FIG. 5 is a plan view illustrating another indication pattern 400-1 able to replace the indication pattern 400. FIG. 4 is an enlarged view of a portion 'B' of FIG. 2, and FIG. 5 is an enlarged view of the indication pattern 400-1.

Referring to FIG. 4, the indication pattern 400 may include an array of a plurality of bar patterns 400B when viewed from a plan view. The bar patterns 400B may be disposed in a portion of the package region 10P between a side surface 231 of the semiconductor chip stack 200 and an edge line 10E of the cutting region 10C. The side surface 231 of the semiconductor chip stack 200 may be a side surface of the second semiconductor chip 230 that faces the edge line 10E of the cutting region 10C.

The bar patterns 400B may extend from a portion adjacent to the side surface 231 of the semiconductor chip stack 200 toward the cutting region 10C such that the bar patterns 400B have bar shapes. The bar patterns 400B may extend from a portion adjacent to the side surface 231 of the semiconductor chip stack 200 toward the side surface 15S of the semiconductor package 10S to have bar shapes. The side surface 15S of the semiconductor package 10S may correspond to a side surface that overlaps with the edge line 10E of the cutting region 10C in a plan view. The bar patterns 400B may extend in a direction substantially perpendicular to the edge line 10E of the cutting region 10C or perpendicular to the side surface 15S of the semiconductor package 10S in a plan view. The bar patterns 400B may extend in a direction substantially perpendicular to the side surface of the first semiconductor chip 210 in a plan view. The bar patterns 400B may also extend in a direction also substantially perpendicular to a side surface of the second semiconductor chip 230.

The bar patterns 400B may have different lengths from each other, where the lengths of the bar patterns 400b extend in a direction perpendicular to the edge line 10E of the cutting region 10C or perpendicular to the side surface 15S of the semiconductor package 10S. First ends 400E of the bar patterns 400B may be aligned with an imaginary reference line RL, and the bar patterns 400B may extend from the reference line RL in any one direction. The reference line RL may denote a reference position of the bar patterns 400B.

As illustrated in FIG. 4, the reference line RL may be set to be a straight line substantially parallel with the side surface 231 of the semiconductor chip stack 200 in a plan view. The reference line RL may be spaced apart from the side surface 231 of the semiconductor chip stack 200 by a certain distance S. Alternatively, the reference line RL may be set to overlap the side surface 231 of the semiconductor chip stack 200 in a plan view. The first ends 400E of the bar patterns 400B may be spaced apart from the side surface 231 of the semiconductor chip stack 200 by a same distance, for example, the distance S. In other words, first ends 400E of the bar patterns 400B may be spaced apart from the first semiconductor chip 210 by substantially a same distance S. Alternatively, the first ends 400E of the bar patterns 400B may be aligned with and may be in contact with the side surface 231 of the semiconductor chip stack 200, or the first ends 400E of the bar patterns 400B may overlap the first semiconductor chip 210 of the semiconductor chip stack 200. In some embodiments, the first ends 400E of the bar patterns 400B may be positioned to face the first semiconductor chip 210.

As illustrated in FIG. 5, an imaginary reference line RL-1 corresponding to the reference line RL may be set to overlap the edge line 10E of the cutting region 10C of the semiconductor package 10M-1. In such a case, first ends 400E-1 of bar patterns 400B-1 constituting the indication pattern 400-1 may be aligned with the edge line 10E of the cutting region 10C. The bar patterns 400B-1 may extend from the reference line RL-1 toward the side surface 231 of the semiconductor chip stack 200 such that the bar patterns 400B-1 have different lengths. In one example, the bar patterns 400B-1 may extend from the side surface 15S of the semiconductor package 10M-1 toward the first semiconductor chip 210 to have different lengths from each other.

Second ends 400E-1 of the bar patterns 400B-1 opposite to the first ends 400E-1 may be spaced apart from the side surface 231 of the semiconductor chip stack 200 by different distances. The second ends 400E-1 of the bar patterns 400B may be positioned to face the first semiconductor chip 210. Distances from the bar patterns 400B-1 to the side surface 231 of the semiconductor chip stack 200 may regularly increase or decrease along an array direction of the bar pattern 400B-1. For example, if the bar patterns 400B-1 include first to fifth bar patterns which are sequentially arrayed in one direction, a distance between the second bar pattern and the side surface 231 may be greater than a distance between the first bar pattern and the side surface 231 by a predetermined amount, and a distance between the third bar pattern and the side surface 231 may be greater than a distance between the second bar pattern and the side surface 231 by the predetermined amount. In addition, a distance between the fourth bar pattern and the side surface 231 may be greater than a distance between the third bar pattern and the side surface 231 by the predetermined amount, and a distance between the fifth bar pattern and the side surface 231 may be greater than a distance between the fourth bar pattern and the side surface 231 by the predetermined amount. That is, lengths of the first to fifth bar patterns constituting the bar patterns 400B-1 may be set to sequentially lessen. The bar patterns 400B-1 may extend in a direction substantially perpendicular to the side surface 231 of the semiconductor chip stack 200 or the edge line 10E of the cutting region 10C in a plan view. The bar patterns 400B-1 may be arrayed to be parallel with each other and to be spaced apart from each other by a same distance.

The imaginary reference line RL-1 may be set to be positioned in the cutting region 10C. The bar patterns 400B-1 illustrated in FIG. 5 may be disposed to have patterns corresponding to a mirror image of the bar patterns 400B illustrated in FIG. 4 in a plan view.

As illustrated in FIG. 4, the bar patterns 400B may extend so that second ends 400F of the bar patterns 400B opposite to the first ends 400E face the edge line 10E of the cutting region 10C. The bar patterns 400B may extend from the reference line RL toward the edge line 10E of the cutting region 10C to have different lengths. In one example, the difference in the lengths between each of the bar patterns 400B may be substantially the same. The bar patterns 400B may be arrayed in a direction parallel with the edge line 10E of the cutting region 10C to be spaced apart from each other by substantially a same distance.

Referring to FIG. 4, lengths of the bar patterns 400B may regularly increase or decrease along a direction parallel with the edge line 10E of the cutting region 10C. For example, if the bar patterns 400B include first to fifth bar patterns 410, 420, 430, 440, and 450 which are sequentially arrayed in a direction parallel with the edge line 10E of the cutting region 10C, the first bar pattern 410 may have a first end 410E that is in contact with the reference line RL and may have a second end 410F that is in contact with the cutting region 10C.

The second bar pattern 420 may be disposed to be spaced apart from the first bar pattern 410 in a direction parallel with the edge line 10E of the cutting region 10C. The second bar pattern 420 may be formed to have a length less than a length of the first bar pattern 410. The second bar pattern 420 may have a first end 420E in contact with the reference line RL and a second end 420F spaced apart by a first distance D1 from the edge line 10E of the cutting region 10C.

The third bar pattern 430 may have a first end 430E in contact with the reference line RL and may extend from the reference line RL toward the cutting region 10C. The third bar pattern 430 may be formed to have a length less than a length of the second bar pattern 420. Accordingly, the third bar pattern 430 may have a second end 430F spaced apart by a second distance D2 from a straight line passing from the second end 420F of the second bar pattern 420 parallel with the edge line 10E.

The fourth bar pattern 440 may have a first end 440E in contact with the reference line RL and may extend from the reference line RL toward the cutting region 10C. The fourth bar pattern 440 may be formed to have a length less than a length of the third bar pattern 430. Accordingly, the fourth bar pattern 440 may have a second end 440F spaced apart by a third distance D3 from a straight line passing from the second end 430F of the third bar pattern 430 to be parallel with the edge line 10E. The fifth bar pattern 450 may have a first end 450E in contact with the reference line RL and may extend from the reference line RL toward the cutting region 10C. The fifth bar pattern 450 may be formed to have a length less than a length of the fourth bar pattern 440. Accordingly, the fifth bar pattern 450 may have a second end 450F spaced apart by a fourth distance D4 from a straight line passing from the second end 440F of the fourth bar pattern 440 to be parallel with the edge line 10E. The first to fourth distances D1, D2, D3, and D4 may be equal to each other. Thus, distances from the first ends 400E of the bar patterns 400 to the first semiconductor chip 210 may be equal to each other.

The second ends 400F of the second to fifth bar patterns 420 430, 440, and 450 may be positioned to face a side surface 15S of the semiconductor package 10S. The second ends 400F of the second to fifth bar patterns 420 430, 440, and 450 may be spaced apart from the side surface 15S of the semiconductor package 10S by different distances. That is, distances from the second to fifth bar patterns 420 430, 440, and 450 to the side surface 15S of the semiconductor package 10S may regularly increase by a distance corresponding to any one of the first to fourth distances D1, D2, D3, and D4. Accordingly, the distances from the side surface 15S of the semiconductor package 10S to the second ends 400F of the bar patterns 410, 420, 430, 440, and 450 may regularly increase by substantially the same distance. Thus, the distances from the side surface 15S of the semiconductor package 10S to the second ends 400F of the bar patterns 410, 420, 430, 440, and 450 may be set to be different from each other.

The first to fifth bar patterns 410, 420 430, 440, and 450 may extend from the reference line RL toward the side surface 15S of the semiconductor package 10S to have different lengths. The lengths of the first to fifth bar patterns 410, 420 430, 440, and 450 may be sequentially reduced.

Referring again to FIG. 5, the bar patterns 400B-1 may be disposed so that distances from the bar patterns 400B-1 to the side surface 231 of the semiconductor chip stack 200 are different from each other. The distances from the bar patterns 400B-1 to the side surface 231 of the semiconductor chip stack 200 may regularly increase or decrease by a same distance.

The bar patterns 400B-1 may extend from the reference line RL-1 toward the side surface 231 of the semiconductor chip stack 200 to have different lengths. The lengths of the bar patterns 400B-1 may be sequentially and regularly reduced in a direction parallel with reference line RL-1. The lengths of the bar patterns 400B-1 may be sequentially and regularly reduced by a same distance. Accordingly, distances from the first semiconductor chip 210 to second ends 400F of the bar patterns 400B may sequentially and regularly increase by substantially the same distance.

Referring again to FIG. 4, because the distances from second ends 400F of the bar patterns 400B to the edge line 10E of the cutting region 10C differ, the number of the bar patterns 400B exposed at a side surface of the semiconductor package 10S may differ according to a sawing position of the sawing blade 600. Thus, the sawing position may be extracted from the number of bar patterns 400B exposed at a side surface of the semiconductor package 10S. That is, the distance 300D-1 between the semiconductor chip stack 200 and the side surface 155-1 of the semiconductor package 10S may be determined using the number of exposed bar patterns 400B at the side surface 155-1 of the semiconductor package 10S.

Figure 6:
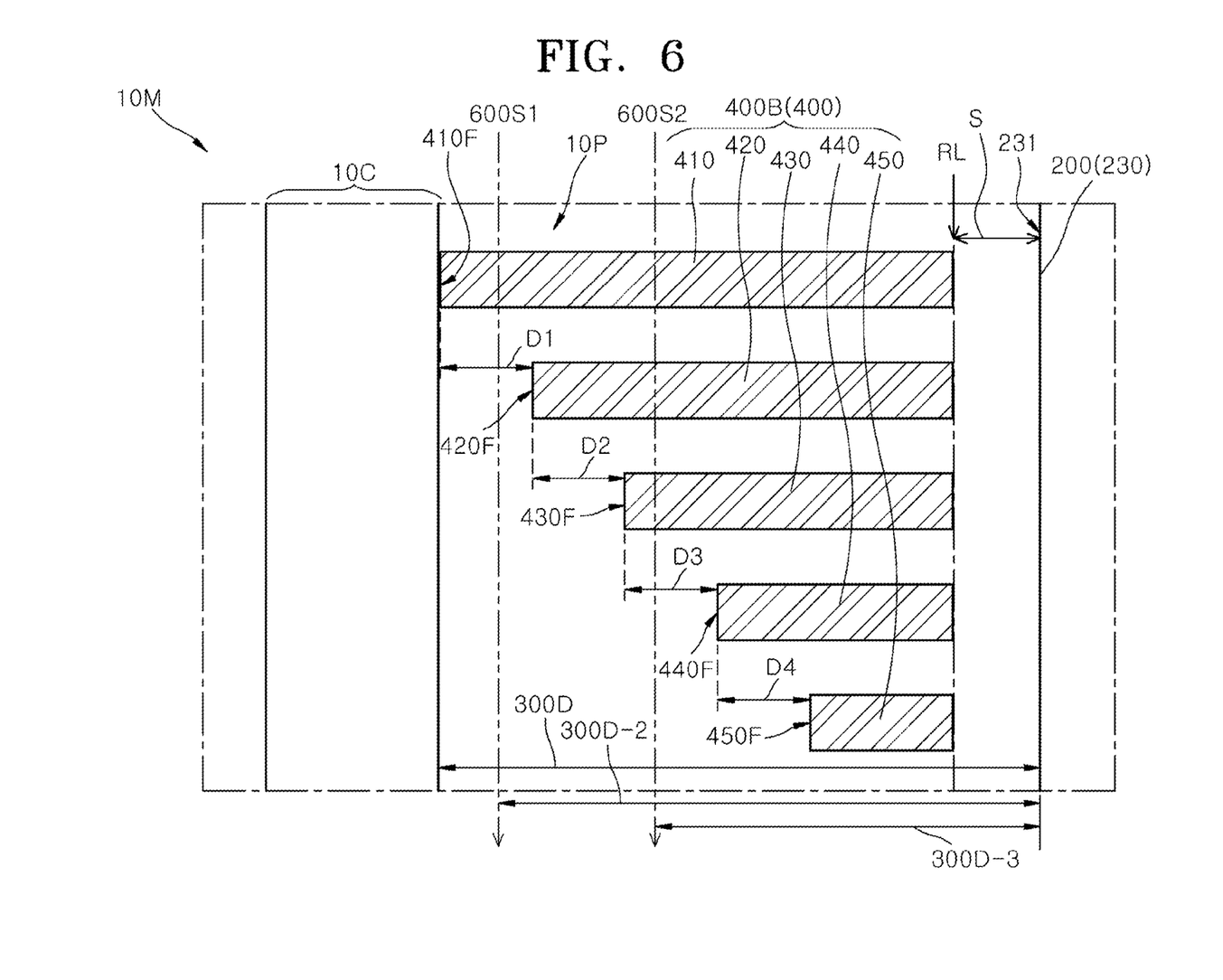
FIGS. 6 to 8 illustrate a method of utilizing an indication pattern employed in a semiconductor package according to an embodiment.
Figure 7:
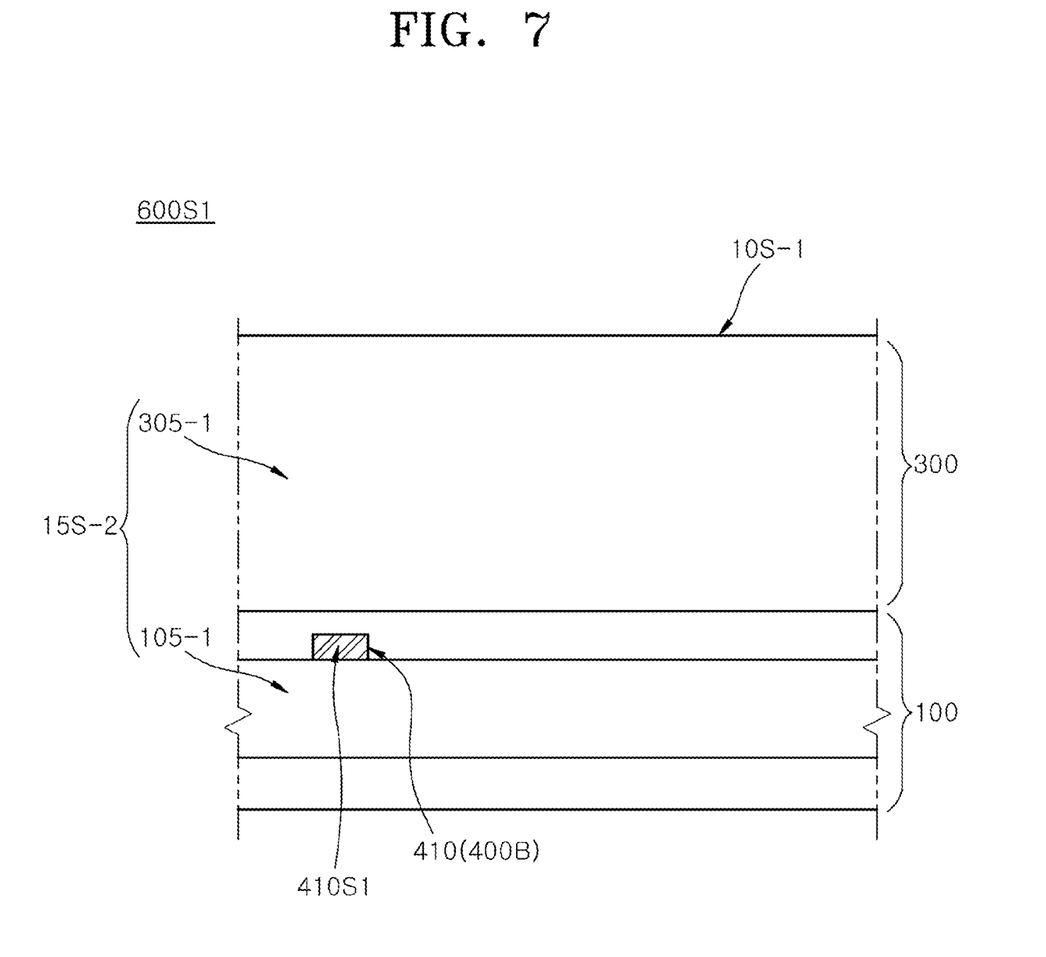
Figure 8:
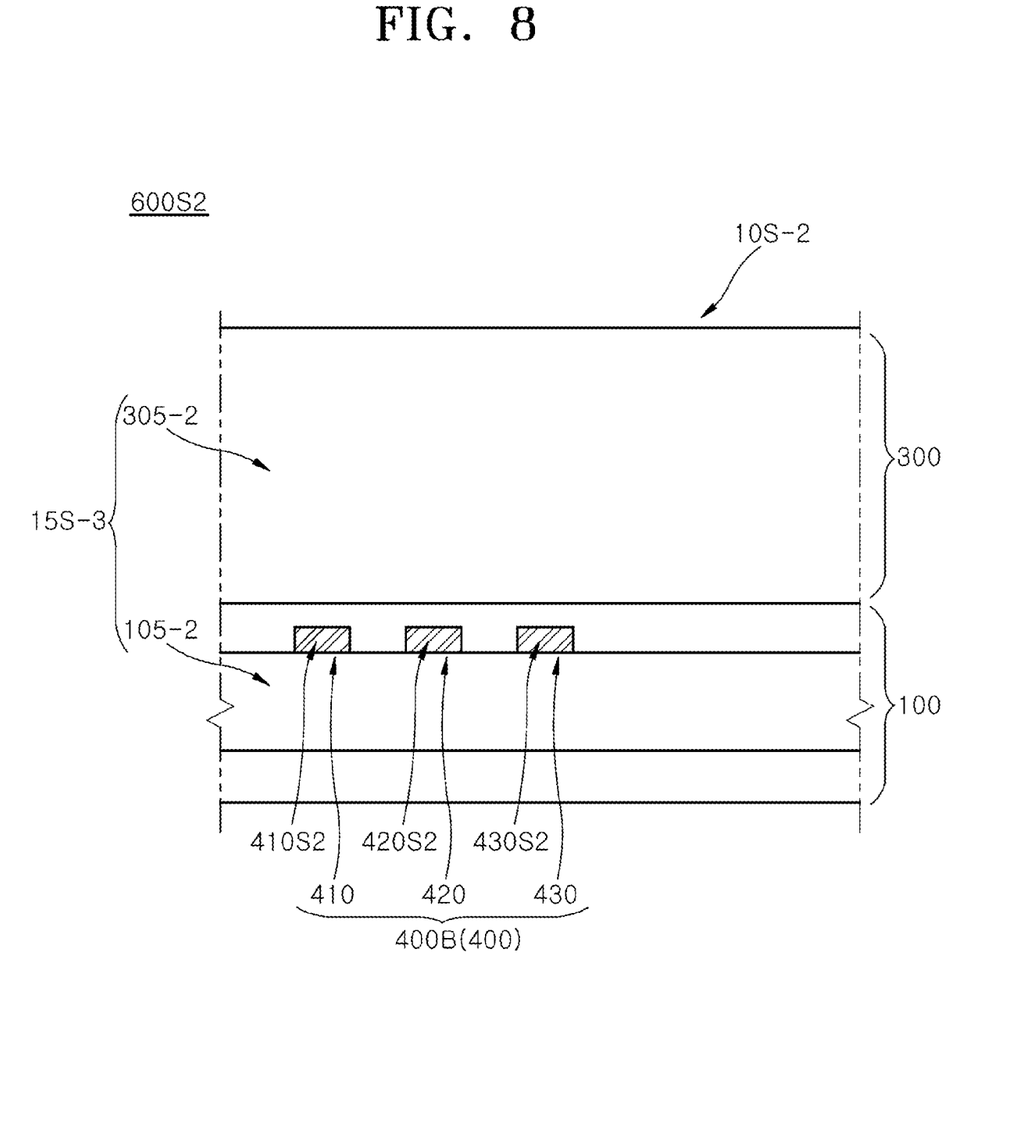

FIGS. 6 to 8 illustrate a method of utilizing the indication pattern 400 employed in the semiconductor package array 10M of FIG. 2.

Referring to FIG. 6, if the sawing blade (600 of FIG. 3) is accurately aligned with the cutting region 10C, only the cutting region 10C may be removed during the sawing process to provide a semiconductor package. The semiconductor package after the sawing process may have a side surface aligned with the edge line 10E of the cutting region 10C. In contrast, if the sawing blade (600 of FIG. 3) is misaligned with the cutting region 10C due to the process tolerance of the sawing machine or the like, a portion of the package region 10P may be removed during the sawing process to provide a semiconductor package (10S-1 of FIG. 7) having a side surface (15S-2 of FIG. 7) which overlaps with a first sawing position 600S1. In addition, if the sawing blade (600 of FIG. 3) is severely misaligned with the cutting region 10C, a cutting position of the sawing process may be shifted more toward the semiconductor chip stack 200 to provide a semiconductor package (10S-2 of FIG. 8) having a side surface (15S-3 of FIG. 8) that overlaps with a second sawing position 600S2.

If the sawing process is performed along the first sawing position 600S1, the semiconductor package 10S-1 may be provided having the side surface 15S-2 of FIG. 7. If the sawing process is performed along the second sawing position 600S2, the semiconductor package 10S-2 may be provided having the side surface 15S-3 of FIG. 8. As illustrated in FIGS. 7 and 8, the number of the bar patterns 400B exposed at the side surface of the semiconductor package 10S-1 or 10S-2 may differ according to the sawing position 600S1 or 600S2.

As illustrated in FIG. 6, if the sawing process is performed along the first sawing position 600S1, only the first bar pattern 410 of the first to fifth bar patterns 410~450 may be cut. Thus, a cut side surface 410S1 of the first bar pattern 410 may be exposed at the side surface 15S-2 of the semiconductor package 10S-1 (see FIG. 7). The side surface 15S-2 of the semiconductor package 10S-1 may include a cut side surface 305-1 of the encapsulant layer 300 and a cut side surface 105-1 of the package substrate 100.

Because the encapsulant layer 300 and the package substrate 100 may include a substantially opaque material, it may be impossible to visually observe the semiconductor chip stack 200 embedded in the semiconductor package 10S-1 without viewing the semiconductor chip stack 200 using X-ray analysis or some similar technique after the sawing process. However, the cut side surface 410S1 of the first bar pattern 410 may remain exposed at the side surface 15S-2 of the semiconductor package 10S-1. Thus, it may be possible to observe the cut side surface 410S1 of the first bar pattern 410 even without using an X-ray analysis technique or the like after the sawing process. That is, it may be possible to visually confirm the number of the bar patterns 400B which are exposed at the side surface 15S-2 of the semiconductor package 10S-1 without using an X-ray analysis technique after the sawing process. Accordingly, it may be possible to obtain information on a position of the side surface 15S-2 of the semiconductor package 10S-1 using the number of the bar patterns 400B which are exposed at the side surface 15S-2. Further, it may be possible to determine a distance 300D-2 between the side surface 15S-2 of the semiconductor package 10S-1 and the semiconductor chip stack 200.

As illustrated in FIG. 6, the second end 410F of the first bar pattern 410 may be in contact with the cutting region 10C. In such a case, the second end 420F of the second bar pattern 420 adjacent to the first bar pattern 410 may be spaced apart by the first distance D1 from the cutting region 10C. The cut side surface 410S1 of the first bar pattern 410 may be exposed at the side surface 15S-2, and the second bar pattern 420 is not exposed at the side surface 15S-2. Thus, it may be understood that the side surface 15S-2 of the semiconductor package 10S-1 is positioned between the second end 410F of the first bar pattern 410 and the second end 420F of the second bar pattern 420.

As a result, if only the cut side surface 410S1 of the first bar pattern 410 is exposed at the side surface 15S-2, it may be understood that the first sawing position 600S1 is positioned between the cutting region 10C and the second bar pattern 420. In such a case, the first sawing position 600S1 may be regarded as being positioned within the range of the first distance D1 from the cutting region 10C. Accordingly, the distance 300D-2 between the first sawing position 600S1 and the semiconductor chip stack 200 may be estimated to be less than the distance 300D between the cutting region 10C and the semiconductor chip stack 200 and to be greater than a distance between the second end 420F of the second bar pattern 420 and the semiconductor chip stack 200.

The first sawing position 600S1 may correspond to a position shifted by a process tolerance of the sawing machine or the like. That is, the first sawing position 600S1 may be a position set undesirably. Thus, it may be difficult to accurately estimate the first sawing position 600S1 without directly measuring the distance 300D-2 between the first sawing position 600S1 and the semiconductor chip stack 200. However, according to an embodiment, it may be possible to easily and accurately determine a location of the first sawing position 600S1 by counting the number of exposed bar patterns 400B at the side surface of the semiconductor package. That is, the distance 300D-2 between the side surface 15S-2 of the semiconductor package 10S-1 and the semiconductor chip stack 200 may be easily and accurately determined by counting the number of the bar patterns 400B exposed at the side surface of the semiconductor package. If values of the first to fourth distances D1, D2, D3, and D4 are reduced, the distance 300D-2 between the side surface 15S-2 of the semiconductor package 10S-1 and the semiconductor chip stack 200 may be more accurately determined.

Referring again to FIGS. 6 and 8, if the sawing process is performed along the second sawing position 600S2, the first to third bar patterns 410, 420, and 430 may be cut while the fourth and fifth bar patterns 440 and 450 are not cut. Thus, a cut side surface 410S2 of the first bar pattern 410, a cut side surface 420S2 of the second bar pattern 420, and a cut side surface 430S2 of the third bar pattern 430 may be exposed at the side surface 15S-3 of the semiconductor package 10S-2. The side surface 15S-3 of the semiconductor package 10S-2 may include a cut side surface 305-2 of the encapsulant layer 300 and a cut side surface 105-2 of the package substrate 100.

As illustrated in FIG. 8, the number of bar patterns 400B exposed at the side surface 15S-3 of the semiconductor package 10S-2 may differ according to a position of the side surface 15S-3 of the semiconductor package 10S-2. For example, in the event that the sawing process is performed along the second sawing position 600S2, the number of the bar patterns 400B exposed at the side surface 15S-3 of the semiconductor package 10S-2 may be three. Thus, the side surface 15S-3 of the semiconductor package 10S-2 may be regarded as being positioned between the second end 430F of the third bar pattern 430 and the second end 440F of the fourth bar pattern 440. That is, the second sawing position 600S2 may be regarded as being positioned between the second end 430F of the third bar pattern 430 and the second end 440F of the fourth bar pattern 440. Accordingly, a distance 300D-3 between the second sawing position 600S2 and the semiconductor chip stack 200 may be less than a distance that remains after subtracting the first and second distances D1 and D2 from the distance 300D ("300D-D1-D2"), and greater than a distance that remains after subtracting the first to third distances D1, D2, and D3 from the distance 300D ("300D-D1-D2-D3").

As described above, an actual location of the second sawing position 600S2 may be estimated by counting the number of the bar patterns 400B exposed at the side surface 15S-3 of the semiconductor package 10S-2. That is, if the number of bar patterns 400B exposed at the side surface 15S-3 of the semiconductor package 10S-2 is three, the distance 300D-3 between the side surface 15S-3 of the semiconductor package 10S-2 and the semiconductor chip stack 200 may be less than a distance of "300D-D1-D2" and is greater than a distance of "300D-D1-D2-D3". If the first to fourth distances D1, D2, D3, and D4 are set to be reduced, the distance 300D-3 between the side surface 15S-3 of the semiconductor package 10S-2 and the semiconductor chip stack 200 may be more accurately estimated. If the first to fourth distances D1, D2, D3, and D4 are set to have the same value, it may be easier to calculate or extract the distance 300D-3 between the side surface 15S-3 of the semiconductor package 10S-2 and the semiconductor chip stack 200.

As illustrated in FIGS. 7 and 8, the semiconductor package 10S-1 or 10S-2 may include the indication pattern 400 comprised of the bar patterns 400B, one or more of which is exposed at the side surface 15S-2 or 15S-3 corresponding to an outer surface of the semiconductor package 10S-1 or 10S-2 after the sawing process is performed. Thus, it may be possible to determine or estimate the distance 300D-2 (or 300D-3) between the side surface 15S-2 (or 15S-3) of the semiconductor package 10S-1 (or 10S-2) and the semiconductor chip stack 200 without using an X-ray analysis technique or the like after the sawing process is performed. Accordingly, it may be possible to sort good packages from failed packages in terms of a package side margin and to realign the sawing blade 600 even without using an X-ray analysis technique or the like after the sawing process is performed.

Figure 9:
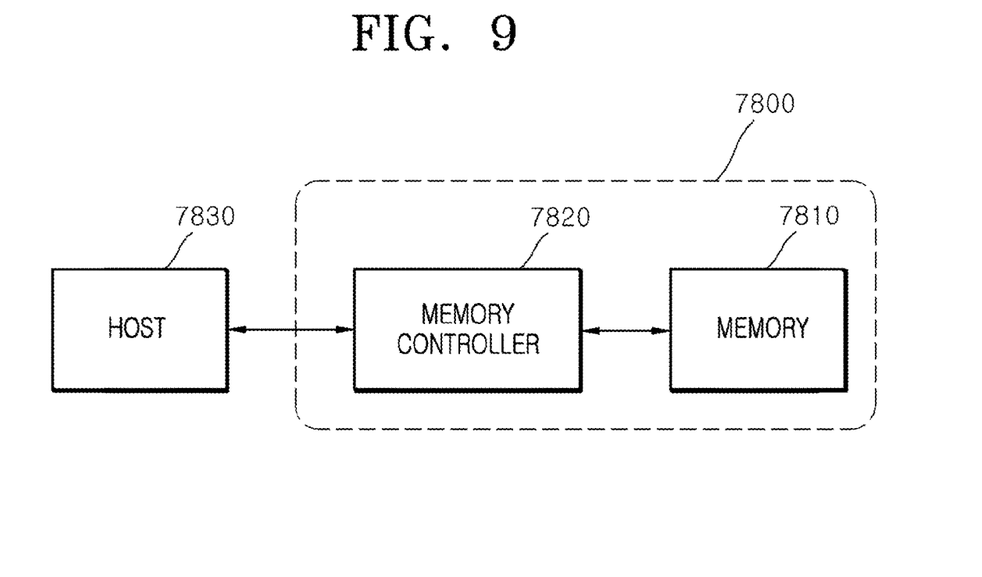
FIG. 9 is a block diagram illustrating an electronic system employing a memory card including a semiconductor package according to an embodiment.

FIG. 9 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 10:
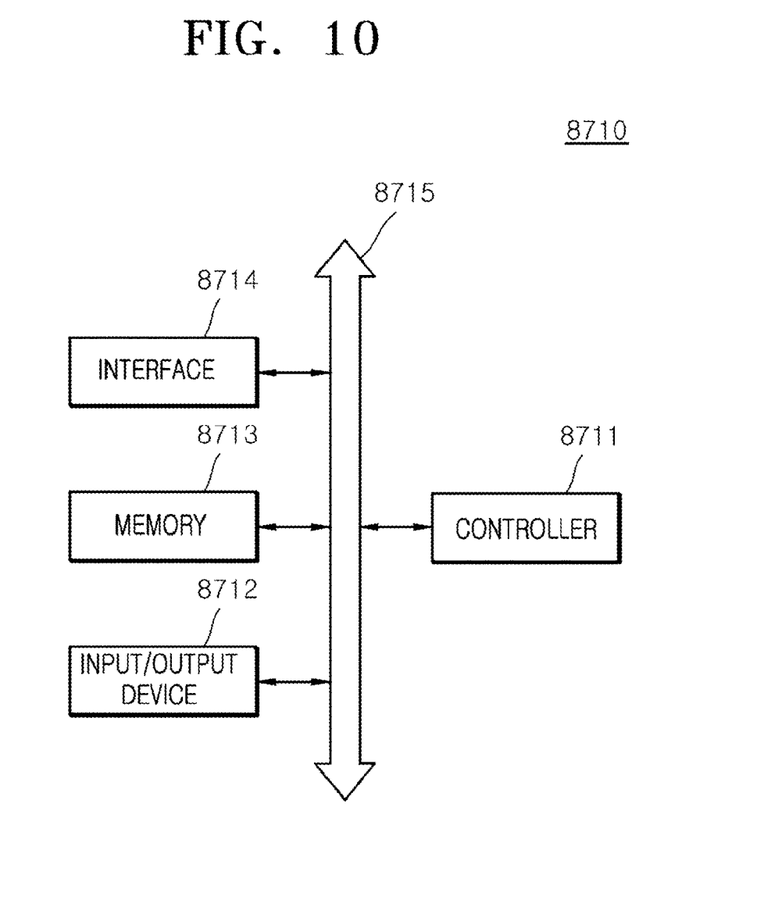
FIG. 10 is a block diagram illustrating another electronic system including a semiconductor package according to an embodiment.

FIG. 10 is a block diagram illustrating an electronic system 8710 including at least one of the packages according to the embodiment. The electronic system 8710 may include a controller 8711, an input/output device 8712, and a memory 8713. The controller 8711, the input/output device 8712, and the memory 8713 may be coupled with one another through a bus 8715 providing a path through which data moves.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is equipment capable of performing wireless communication, the electronic system 8710 may be used in a communication system using a technique of CDMA (code division multiple access), GSM (global system for mobile communications), NADC (North American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
   a package substrate;
   a first semiconductor chip on the package substrate;
   bar patterns disposed within the package substrate, each bar pattern having a first end and a second end; and
   an encapsulant layer formed to cover at least the bar patterns and the first semiconductor chip, wherein the semiconductor package having the encapsulant layer has a side surface with exposing one or more second ends of the bar patterns;
   wherein the bar patterns having different lengths are positioned substantially along a predetermined direction with respect to the first semiconductor chip such that the one or more second ends of the bar patterns exposed through the side surface of the semiconductor package indicate a distance between the side surface and the first semiconductor chip.

2. The semiconductor package of claim 1, wherein the predetermined direction of the bar patterns is substantially perpendicular to the cut surface of the semiconductor package.

3. The semiconductor package of claim 2, wherein the bar patterns are spaced apart from each other in parallel.

4. The semiconductor package of claim 1, wherein the bar patterns are arranged such that the first ends thereof are positioned at a substantially same distance away from the first semiconductor chip.

5. The semiconductor package of claim 1, wherein the bar patterns are arranged such that the first ends thereof are positioned so as to overlap above or below the first semiconductor chip.

6. The semiconductor package of claim 1, wherein, the second ends thereof are positioned at different distances away from the semiconductor chip such that portions of the bar patterns near the second ends are exposed when the semiconductor package is cut.

7. The semiconductor package of claim 6, wherein, the length difference between any two adjacent bar patterns is substantially same.

8. The semiconductor package of claim 1,
wherein the first ends of the bar patterns are arranged toward the first semiconductor chip at a predetermined distance such that the seconds of the bar patterns having different lengths are arranged at different distances away from the semiconductor chip.

9. The semiconductor package of claim 1, wherein the bar patterns are arranged in order of increasing or decreasing lengths.

10. The semiconductor package of claim 9, wherein the length difference between any two adjacent bar patterns is substantially same.

11. The semiconductor package of claim 1,
wherein the package substrate comprises interconnection patterns; and
wherein the bar patterns are positioned at the same level as at least one interconnection pattern.

12. The semiconductor package of claim 11, wherein at least one of the interconnection patterns is positioned at a level closer to the first semiconductor chip than the levels of the other interconnection patterns.

13. The semiconductor package of claim 1,
wherein a side surface of the semiconductor package includes an outer side surface of the encapsulant layer, a side surface of the package substrate, and a side surface of at least one of the bar patterns; and
wherein a number of the bar patterns exposed at the cut surface of the semiconductor package differs according to a position of the cut surface of the semiconductor package.

14. The semiconductor package of claim 1, further comprising a second semiconductor chip stacked on the first semiconductor chip and offset from the first semiconductor chip.

15. The semiconductor package of claim 1, further comprising:
an additional semiconductor chip disposed between the first semiconductor chip and the package substrate; and
a supporting part disposed between the first semiconductor chip and the package substrate to support the first semiconductor chip and to provide a cavity in which an additional semiconductor chip is disposed.

16. A semiconductor package comprising:
a package substrate;
a first semiconductor chip disposed on the package substrate;
an encapsulant layer covering the first semiconductor chip; and
an array of bar patterns constituting an indication pattern disposed in or on the package substrate,
wherein the bar patterns include first ends being in contact with a side surface of the semiconductor package and second ends positioned to face the first semiconductor chip, and
wherein lengths of the bar patterns are different from each other.

17. The semiconductor package of claim 16, wherein the bar patterns extend in a first direction substantially perpendicular to a side surface of the first semiconductor chip in a plan view.

18. The semiconductor package of claim 17, wherein the bar patterns are arrayed to be spaced apart from each other by substantially a same distance in a second direction perpendicular to the first direction in a plan view.

19. The semiconductor package of claim 16, wherein the second ends of the bar patterns are spaced apart from the first semiconductor chip by different distances.

20. A semiconductor package comprising:
a package substrate;
a first semiconductor chip on the package substrate;
bar patterns disposed within the package substrate, each bar pattern having a first end and a second end; and
an encapsulant layer formed to cover at least the bar patterns, wherein a portion of the semiconductor package having the encapsulant layer is capable of being cut to expose one or more bar patterns covered therein through a cut surface;
wherein the bar patterns having different lengths are positioned substantially along a predetermined direction with respect to the first semiconductor chip such that the one or more bar patterns exposed through the cut surface of the semiconductor package indicate a distance between the cut surface and the first semiconductor chip.

* * * * *